(12) United States Patent
Hirose et al.

(10) Patent No.: US 7,187,014 B2
(45) Date of Patent: Mar. 6, 2007

(54) SEMICONDUCTOR DEVICE AND METHOD FOR FABRICATING THE SAME

(75) Inventors: Yutaka Hirose, Kyoto (JP); Daisuke Ueda, Osaka (JP); Tsuyoshi Tanaka, Osaka (JP); Yasuhiro Uemoto, Shiga (JP); Tomohiro Murata, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/862,452

(22) Filed: Jun. 8, 2004

(65) Prior Publication Data

US 2005/0082568 A1    Apr. 21, 2005

(30) Foreign Application Priority Data

Jun. 10, 2003    (JP) .............................. 2003-165287
May 10, 2004    (JP) .............................. 2004-140251

(51) Int. Cl.
*H01L 29/772*    (2006.01)
(52) U.S. Cl. .................. 257/192; 257/194; 257/280; 257/284; 257/743; 257/E21.407; 438/285; 438/590; 323/282
(58) Field of Classification Search ........ 257/E21.407, 257/E29.253, 192, 194, 280, 284, 743, 104, 257/745–747, 76; 438/285, 590; 323/282, 323/286
See application file for complete search history.

(56) References Cited

U.S. PATENT DOCUMENTS 5,563,428 A * 10/1996 Ek et al. .................... 257/77
5,670,798 A * 9/1997 Schetzina .................... 257/96
5,923,058 A * 7/1999 Agarwal et al. ............ 257/198
6,521,998 B1 * 2/2003 Teraguchi et al. .......... 257/745
6,861,828 B2 * 3/2005 Watanabe .................... 323/282
2001/0012678 A1 * 8/2001 Tanaka et al. .............. 438/481
2002/0119610 A1 * 8/2002 Nishii et al. ................ 438/167
2002/0139995 A1 * 10/2002 Inoue et al. ................ 257/194
2002/0171405 A1 * 11/2002 Watanabe .................... 323/282
2004/0061129 A1 * 4/2004 Saxler et al. ................ 257/192

FOREIGN PATENT DOCUMENTS

| JP | 5-155958 A | 6/1993 |
| JP | 9-172164 A | 6/1997 |
| JP | 11-121472 A | 4/1999 |

* cited by examiner

*Primary Examiner*—Kenneth Parker
*Assistant Examiner*—Chris C. Chu
(74) *Attorney, Agent, or Firm*—McDermott Will & Emery LLP

(57) ABSTRACT

A semiconductor device has a sapphire substrate, a semiconductor layer made of GaN provided on the sapphire substrate, a multilayer film provided on the semiconductor layer, and an electrode in ohmic contact with the multilayer film. The multilayer film has been formed by alternately stacking two types of semiconductor layers having different amounts of piezopolarization or different amounts of spontaneous polarization and each containing an n-type impurity so that electrons are induced at the interface between the two types of semiconductor layers. This allows the contact resistance between the electrode and the multilayer film and a parasitic resistance in a current transmission path to be reduced to values lower than in a conventional semiconductor device.

5 Claims, 10 Drawing Sheets

Ten Al$_{0.15}$Ga$_{0.85}$N-GaN Stacked Layers

Al$_{0.15}$Ga$_{0.85}$N (1nm)
GaN (1nm)

n-GaN    Induced Electrons
GaN
Ef
n+GaN
Al$_{0.15}$Ga$_{0.85}$N
Charges Resulting from Sheet-Like Doping of Al$_{0.15}$Ga$_{0.85}$N with Si

|  | Sample 1 | Sample 2 |
|---|---|---|
| δ-Doped Position (nm) | None | 2nm |
| Contact Resistance ($\Omega cm^2$) | $4 \times 10^{-5}$ | $8 \times 10^{-6}$ |
| Sheet Resistance ($\Omega/\Box$) | 174 | 164 |

| AlGaN/GaN Film Thickness Combination | Contact Resistance ($\Omega mm$) |
|---|---|
| 3.5nm/3.5nm | 3.0 |
| 5.0nm/2.5nm | 2.0 |
| 6.0nm/1.5nm | 1.0 |

SEMICONDUCTOR DEVICE AND METHOD FOR FABRICATING THE SAME

The present application claims priority under 35 U.S.C. § 119(a) to Japanese Patent Applications JP 2003-165287 and JP 2004-140251, the entire contents of which are incorporated herein by reference.

BACKGROUND OF THE INVENTION

1. Technical Field to Which the Invention Pertains

The present invention relates to a semiconductor device using a compound semiconductor and a method for fabricating the same and, more particularly, to a semiconductor device using a group III nitride semiconductor and a method for fabricating the same.

2. Prior Art

Because of its advantages including a wide band gap, a resultant high breakdown voltage, a high electron saturation velocity, a high mobility, and a high electron concentration in a heterojunction, the research and development of a group III nitride semiconductor have been promoted with a view to applying it to a short-wavelength light emitting element, a high-output RF element, an RF low-noise amplifier element, or the like. To enhance the characteristics of such a group III nitride semiconductor element, it is required to minimize parasitic resistance components such as a contact resistance and a channel resistance in the semiconductor element. In the case of transporting electrons as a current, it is necessary to form an ohmic contact in a region where electrons are conducted (hereinafter generally referred to as an electron channel) from the outside thereof.

FIGS. 11A and 11B are cross-sectional views illustrating a method for forming an ohmic contact in an electron channel in a conventional semiconductor device. FIG. 12 is a cross-sectional view showing an example of the conventional semiconductor device formed with the ohmic contact. A description will be given to a normal method for forming an ohmic contact with reference to these drawings.

First, as shown in FIG. 11A, a gallium nitride (GaN) semiconductor layer 162 as an active layer is formed on a sapphire substrate 161 as a mother substrate. Then, a multilayer metal thin film 163 including Ti as a lowermost layer and Al, Ni, Au, and the like thereabove is formed by a lift-off process on the GaN semiconductor layer (group III nitride semiconductor layer) 162.

Next, as shown in FIG. 11B, annealing is performed at a high temperature (not less than 500° C. and not more than 900° C.), thereby causing a reaction between the Ti layer and N in the GaN semiconductor layer 162 and forming a nitrogen void, while forming a region 164 with an increased metallic property in the vicinity of the upper surface of the GaN semiconductor layer 162. At the same time, Ga and Al also react with N in GaN, similarly to Ti. This lowers a contact resistance between the GaN semiconductor layer 162 and the multilayer metal thin film 165.

For a lower contact resistance, there is also used a method in which the ohmic contact formation region of a semiconductor layer to be brought into contact with a metal film is doped with an n-type impurity at a highest possible concentration prior to the formation of a contact electrode.

In an example shown in FIG. 12, on the other hand, a group III nitride semiconductor layer 172 serving as a channel layer and a barrier layer 173 made of a group III nitride semiconductor larger in band gap than the semiconductor forming the channel layer are provided on a SiC substrate 171 in an ascending order and a gate electrode 177 is provided on the barrier layer 173. In addition, a group III nitride semiconductor layer 176 containing an impurity at a high concentration is formed on the barrier layer 173 and a source electrode 174 and a drain electrode 175 are provided on the group III nitride semiconductor layer 176. To reduce a parasitic resistance in a field effect transistor having such a structure, a method has been used which extensively forms the nitride semiconductor layer 176 heavily doped with an impurity to a position close to the gate electrode or forms a recessed structure. By extending the nitride semiconductor layer 176 which is lower in resistance than the group III nitride semiconductor layer 172 serving as the channel layer to the position close to the gate electrode 177, the resistance of a current flowing between the source and the drain has been lowered. Moreover, reductions in respective resistances between the source and drain and the barrier layer 173 have also been intended.

SUMMARY OF THE INVENTION

However, the foregoing conventional methods for forming an ohmic contact have a problem that, when the group III nitride semiconductor forming a positive layer is of n-type, the work function of the electrode metal (Ti) used normally is not sufficiently low and the lower limit of the contact resistance obtained is defined thereby. Another problem is that, when the nitride semiconductor forming the positive layer is of p-type, there is no metal having a sufficiently high work function and the lower limit of the contact resistance obtained is defined thereby.

As an approach to solve the problems, there has been adopted a method in which a group III nitride semiconductor narrower in band gap than a heavily doped positive layer formed between the electrode and the surface of the group III nitride semiconductor is formed between the electrode and the group III nitride semiconductor layer serving as the positive layer or, alternatively, the portion of the group III nitride semiconductor layer serving as the positive layer which is located immediately under the contact electrode is heavily doped with an impurity corresponding to the carrier type. However, in these cases also, the maximum carrier concentration achieved is defined by the activation ratio of an impurity ($5\times10^{18}$ cm$^{-3}$ to $3\times10^{19}$ cm$^{-3}$) and the lower limit of the contact resistance obtained is also defined by this value. The problem of the maximum carrier concentration being defined by the carrier concentration in the heavily doped nitride semiconductor layer formed between the electrode and the positive layer similarly occurs even in the case where the contact structure is applied to the source/drain electrodes of a field effect transistor. In a recessed structure in which the gate electrode is formed directly on the nitride semiconductor layer serving as the positive layer, in particular, a transverse parasitic resistance from the electrode to the vicinity of the gate and a channel layer located immediately thereunder has been defined by the maximum carrier concentration in the group III nitride semiconductor layer 176 (see FIG. 12).

There is also a problem that, in the step of forming the recessed structure, a normal dry etching process is low in selectivity among the nitride semiconductor layer 172 serving as the channel layer, the barrier layer 173, and the group III nitride semiconductor layer 176 which compose a multilayer structure and therefore precise control of the depth of the recess is difficult.

It is therefore an object of the present invention to provide a compound semiconductor device having a higher current driving ability than a conventional semiconductor device and a method for fabricating the compound semiconductor device.

A first semiconductor device of the present invention comprises: a substrate; a multilayer film composed of at least one or more first semiconductor layers to be polarized and at least one or more second semiconductor layers having a polarization characteristic different from a polarization characteristic of each of the first semiconductor layers which are alternately stacked and provided on or above the substrate; and an ohmic electrode provided on the multilayer film.

This allows the generation of charge resulting from the different characteristics at the interfaces between the first and second semiconductor layers and thereby reduces the contact resistance in the ohmic electrode to a value lower than in a conventional semiconductor device. As a result, the current driving ability of the semiconductor device can be improved.

In the case where the first and second semiconductor layers have different amounts of piezopolarization, the contact resistance can be reduced.

In the case where the first and second semiconductor layers have different amounts of spontaneous polarization also, the contact resistance can be reduced. In particular, a larger amount of charge can be generated if the first and second semiconductor layers have different amounts of piezopolarization.

Each of the first semiconductor layers is larger in band gap than each of the second semiconductor layers and, of the multilayer film, the second semiconductor layer into which an impurity has been introduced is provided under the ohmic electrode. The arrangement can reduce the resistance between the ohmic electrode and the channel.

An impurity layer is further provided in a part of either of the first and second semiconductor layers. The arrangement implements a so-called δ-doped structure and thereby achieves a further reduction in resistance value in the multilayer film.

If the impurity layer is provided in the first semiconductor layer, in particular, the contact resistance can further be reduced favorably.

An impurity has been introduced into each of the second and first semiconductor layers. The arrangement allows the generation of a larger amount of charge at the interface between the first and second semiconductor layers.

Each of the first semiconductor layers is made of $Al_xGa_{1-x}N$ ($0<x<1$) and each of the second semiconductor layers is made of GaN. This results in a combination of materials having different amounts of piezopolarization and different amounts of spontaneous polarization and thereby achieves a greater reduction in contact resistance than in a conventional semiconductor device.

In the foregoing case, an n-type impurity has preferably been introduced into one or both of the first and second semiconductor layers.

The multilayer film is composed of a first multilayer film and a second multilayer film provided in mutually separated relation, the ohmic electrode includes a source electrode provided on the first multilayer film and a drain electrode provided on the second multilayer film, and the semiconductor device further comprises: a third semiconductor layer provided on the substrate and under the multilayer film; a barrier layer provided on the third semiconductor layer and under the multilayer film and made of a semiconductor larger in band gap than the third semiconductor layer; and a gate electrode provided on the barrier layer to be located between the first and second multilayer films. The arrangement reduces the resistance in each of the source and drain electrodes and implements a HFET with a high current driving ability.

In this HEFT, the first multilayer film, the source electrode, the second multilayer film, and the drain electrode are formed to present a staircase configuration with respect to the gate electrode. The arrangement allows carriers to travel in each of the first and second multilayer films with low resistance values to reach a position closer to the gate electrode and thereby achieves a reduction in parasitic resistance.

If each of the first semiconductor layers has a thickness corresponding to not less than one atomic layer and not more than 100 atomic layers, carriers resulting from a polarization difference can easily tunnel through the first semiconductor layer favorably.

Preferably, each of a material composing the source electrode and a material composing the drain electrode has a work function of 3 eV or less.

Each of the first and third semiconductor layers is made of AlGaN and a content of Al in the third semiconductor layer is higher than the content of Al in each of the first and second semiconductor layers. Accordingly, an oxidation rate for the third semiconductor layer is lower than oxidation rates for the first and second semiconductor layers. This enables more precise control of the depth of a recess in the process steps of fabricating a HEFT having a recessed structure.

At least one δ-doped layer is provided in a region of the barrier layer positioned at a distance of 20 nm or less from an upper surface of the barrier layer. The arrangement lowers the energy level of a conduction band in the barrier layer and allows easier tunneling of electrons than in the case where the δ-doped layer is not provided. As a result, the contact resistance at the interface between the ohmic electrode and the multilayer film is reduced effectively and a driving current can be increased compared with that in the conventional semiconductor device.

The first semiconductor layer is thicker than the second semiconductor layer and an impurity has been introduced into the first semiconductor layer. The arrangement allows a significant reduction in the contact resistance between the multilayer film and the ohmic electrode.

Preferably, an n-type impurity has been introduced into each of the first or second semiconductor layers.

A second semiconductor device of the present invention comprises: a substrate; a first group III nitride semiconductor layer provided on the substrate and in which carriers travel during a driving operation; a barrier layer provided on the first group III nitride semiconductor layer and larger in band gap than the first group III nitride semiconductor layer; and an ohmic electrode provided on or above the barrier layer, wherein a doped layer containing an impurity is provided in a region of the barrier layer positioned at distance of 20 nm or less from an upper surface of the barrier layer.

The provision of the doped layer in the region of the barrier layer positioned at a distance of 20 nm from the upper surface of the barrier layer lowers a conduction band edge energy in the barrier layer, allows easy occurrence of the tunneling of electros as carriers, and reduces the contact resistance. As a result, a driving current can be increased compared with that in the conventional semiconductor device.

In particular, the doped layer is a δ-doped layer. The arrangement allows an effective reduction in contact resistance, while suppressing scattering caused by an introduced impurity or the like.

The semiconductor device further comprises: a gate electrode provided on the barrier layer, wherein the ohmic electrode includes a source electrode and a drain electrode arranged to have the gate electrode interposed therebetween. The arrangement allows the implementation of a HFET with a larger driving current used favorably in, e.g., communication equipment or the like.

The source electrode and the drain electrode are provided above the barrier layer and the semiconductor device further comprises: a second group III nitride semiconductor layer provided on the barrier layer and under the source electrode and containing an impurity; and a third group III nitride semiconductor layer provided on the barrier layer and under the drain electrode and containing an impurity of the same conductivity type as a conductivity type of the second group III nitride semiconductor layer. The arrangement allows a reduction in contact resistance.

A method for fabricating a semiconductor device of the present invention comprises the steps of: (a) forming a multilayer film containing a nitride semiconductor on a barrier layer of a semiconductor substrate comprising a first nitride semiconductor layer provided on a substrate to serve as a channel layer and the barrier layer made of a semiconductor provided on the first nitride semiconductor layer; (b) selectively oxidizing a part of the multilayer film; (c) selectively etching the oxidized portion of the multilayer film to expose the barrier layer; (d) forming a gate electrode on the barrier layer exposed in the step (c); and (e) forming a source electrode and a drain electrode on the multilayer film such that the gate electrode is interposed therebetween.

The method allows the fabrication of a semiconductor device having a recessed structure and functioning as a HEFT with a high current driving ability.

DESCRIPTION OF THE PREFERRED EMBODIMENTS

Embodiment 1

A semiconductor device in a first embodiment of the present invention will be described with reference to FIG. 1.

Figure 1A:
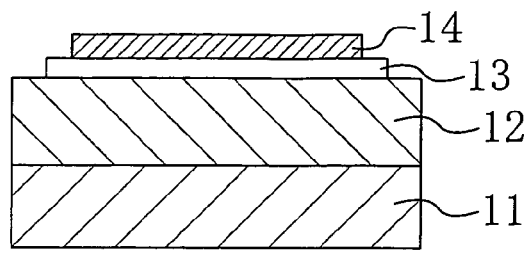
FIG. 1A is a cross-sectional view showing a semiconductor device according to a first embodiment of the present invention.
Figure 1B:
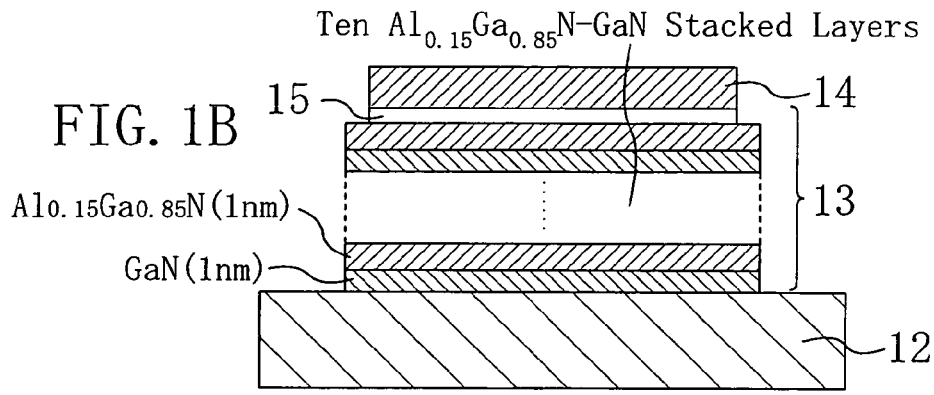
FIG. 1B is an enlarged cross-sectional view showing a structure of a multilayer film in the semiconductor device according to the present embodiment.
Figure 1C:
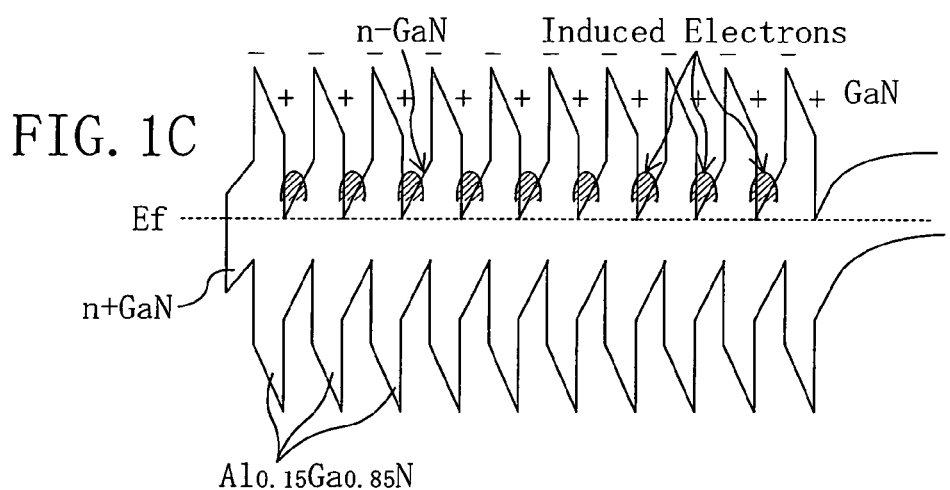
FIG. 1C is an energy band diagram in a cross section of the multilayer film vertical to a substrate surface.
Figure 1D:
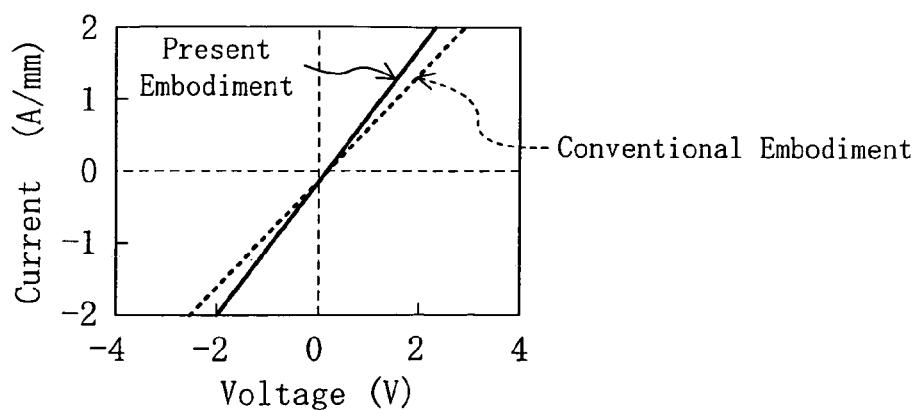
FIG. 1D is a view showing the current-voltage characteristic of each of the semiconductor device according to the first embodiment and a conventional semiconductor device.

FIG. 1A is a cross-sectional view showing the semiconductor device according to the first embodiment. FIG. 1B is an enlarged cross-sectional view showing a structure of a multilayer film 13 in the semiconductor device of the present embodiment. FIG. 1C is an energy band diagram in a cross section of the multilayer film 13 vertical to a substrate surface. FIG. 1D is a view showing the current-voltage characteristic of each of the semiconductor device of the present embodiment and a conventional semiconductor device.

As shown in FIGS. 1A and 1B, the semiconductor device of the present embodiment comprises: a sapphire substrate 11 as a mother substrate; a semiconductor layer 12 made of a gallium nitride (GaN) with a thickness of about 2 μm which is provided on the sapphire substrate 11; a multilayer film 13 consisting of ten $Al_{0.15}Ga_{0.85}N$ layers each having a thickness of 1 nm and ten GaN layers each having a thickness of 1 nm which are alternately deposited by epitaxial growth on the semiconductor layer 12; and a Ti/Al electrode 14 formed on the multilayer film 13. The multilayer film 13 is in ohmic contact with the electrode 14.

Of the multilayer film 13, the GaN layer 15 immediately underlying the electrode 14 is doped with Si at a high concentration of, e.g., about $5\times10^{19}$ cm$^{-3}$. Each of the $Al_{0.15}Ga_{0.85}N$ layers and the GaN layers other than the GaN layer 15 has also been doped with Si at a concentration of about $5\times10^{19}$ cm$^{-3}$.

In the multilayer film 13 described above, positive charge and negative charge are generated in the $Al_{0.15}Ga_{0.85}N$ layers and the GaN layers, respectively, due to a spontaneous polarization difference and a piezopolarization difference between the two materials, as shown in FIG. 1C. Since the multilayer film 13 has been doped with an n-type impurity (Si), a large amount of free charge composed of electrons is induced by the polarization charge in the multilayer film 13 and accumulated at a concentration of about $1\times10^{13}$ cm$^{-2}$ at each of the interfaces between the $Al_{0.15}Ga_{0.85}N$ layers and the GaN layers. This corresponds to $5\times10^{19}$ cm$^{-3}$ in terms of a volume concentration, which is exceeding an upper limit value (2 to $3\times10^{19}$ cm$^{-3}$) achieved by normal doping with an n-type impurity. In addition, each of the $Al_{0.15}Ga_{0.85}N$ layers has an extremely small thickness of 1 nm so that the electrons contributing to conduction in the GaN layer easily tunnel through the potential barrier of the $Al_{0.15}Ga_{0.85}N$ layer and therefore an electric resistance does not increase in the multilayer film 13.

Accordingly, the value of a current flowing in the electrode 14 when a voltage is applied between the sapphire substrate 11 and the electrode 14 is higher than in the conventional semiconductor device, as shown in FIG. 1D. In other words, the I-V characteristic has a larger gradient in the semiconductor device of the present embodiment than in the conventional semiconductor device and the contact resistance has been reduced by about 20%.

Thus, in the semiconductor device of the present embodiment, the contact resistance has been reduced more greatly than in the conventional semiconductor device by stacking layers made of materials having a spontaneous polarization difference and a piezopolarization difference therebetween.

Although the present embodiment has stacked the $Al_{0.15}Ga_{0.85}N$ layers and the GaN layers in the multilayer film, a mixture ratio between Al and Ga may be arbitrary. It is also possible to stack $Al_xGa_{1-x}N$ ($0 \leq x \leq 1$) layers and GaN layers.

The contact resistance can also be reduced even when a multilayer film is formed by using a combination of semiconductors having either a spontaneous polarization difference or a piezopolarization difference therebetween other than the combination of the $Al_xGa_{1-x}N$ ($0 \leq x \leq 1$) layer and the GaN layer. For example, it is possible to use a combination of $Pb_xZ_yTi_zO_{2-x-y-z}/Pb_{x'}Z_{y'}Ti_{z'}O_{2-x'-y'-z'}$ ($0 \leq x \leq 1$, $0 \leq y \leq 1$, $0 \leq z \leq 1$, $0 \leq x' \leq 1$, $0 \leq y' \leq 1$, $0 \leq z' \leq 1$), in which only piezopolarization is dominant. It is also possible to use another combination such as $Ba_xSr_{1-x}TiO_3/Ba_ySr_{1-y}TiO_3$, $K_xTa_{1-x}TiO_3/K_yTa_{1-y}TiO_3$, $Ca_xTi_{1-x}O_3/Ca_yTi_{1-y}O_3$ ($x \neq y$).

Since the epitaxially grown pseudo-morphic $Al_{0.15}Ga_{0.85}N$/GaN crystal has been used in the multilayer film 13 according to the present embodiment, a piezopolarization difference has occurred between the $Al_{0.15}Ga_{0.85}N$ layer and the GaN layer. Even if a relaxed crystal is used, however, a spontaneous polarization difference exists between the two materials so that free charge corresponding thereto is induced at the interface therebetween. In this case also, an amount of induced charge is about $5\times10^{12}$ cm$^{-2}$ but the same effects as achieved in the present embodiment are achievable by, e.g., halving the respective film thicknesses of the individual layers composing the multilayer film.

Since the thickness of each of the $Al_{0.15}Ga_{0.85}N$ layers used in the present embodiment is about 1.0 nm and sufficiently small, electrons in the GaN layer can easily tunnel through the $Al_{0.15}Ga_{0.85}N$ layer by conduction. However, the maximum number of atomic layers that allows the tunnel conduction of electrons is about 100. Accordingly, the thickness of the $Al_{0.15}Ga_{0.85}N$ layer is preferably not less than 1 atomic layer and not more than 100 atomic layers (about not less than 0.3 nm and not more than 50 nm). By contrast, the thickness of the GaN layer is normally adjusted to not less than 1 nm and not more than 10 nm.

Although the multilayer film 13 has been formed by ten times repeating alternate stacking of the $Al_{0.15}Ga_{0.85}N$/GaN layers in the semiconductor device according to the present embodiment, the contact resistance can be reduced if the alternate stacking of the $Al_{0.15}Ga_{0.85}N$/GaN layers is performed once or more times. However, it is preferred to alternately stack a plurality of $Al_{0.15}Ga_{0.85}N$ layers and a plurality of GaN layer because, in the arrangement, a larger amount of interfacial charge increases the number of overlapping portions between the wave functions of the electrons and the resistance can be reduced thereby.

In the case of alternately stacking a plurality of $Al_{0.15}Ga_{0.85}N$ layers and a plurality of GaN layers, the individual $Al_{0.15}Ga_{0.85}N$ layers may have different thicknesses and the individual GaN layers may have different thicknesses. In short, it is sufficient for the $Al_{0.15}Ga_{0.85}N$/GaN layers to be alternately stacked once or more times.

Because the multilayer 13 has been composed of the $Al_{0.15}Ga_{0.85}N$ layers and the GaN layers in the semiconductor device according to the present embodiment, the n-type impurity has been introduced. However, an impurity to be introduced differs depending on the combination of semiconductor layers so that there is a case where a p-type impurity is introduced. However, since an electron generally has a higher mobility than a hole, it is more preferable to use the combination of the $Al_{0.15}Ga_{0.85}N$ layer and the GaN layer using an n-type impurity.

Embodiment 2

As a second embodiment of the present invention, a semiconductor device using Li smaller in work function than Ti as an electrode material will be described.

Figure 2A:
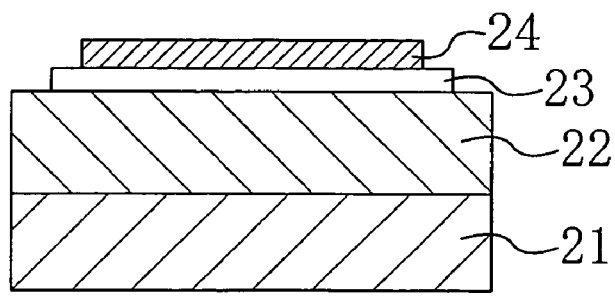
FIG. 2A is a cross-sectional view showing a semiconductor device according to a second embodiment of the present invention.
Figure 2B:
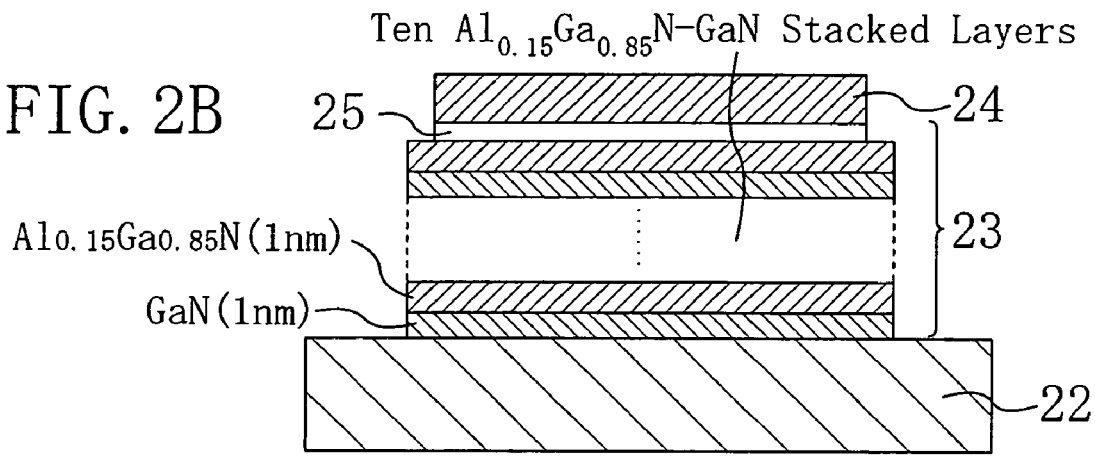
FIG. 2B is an enlarged cross-sectional view showing a structure of a multilayer film in the semiconductor device according to the second embodiment.
Figure 2C:
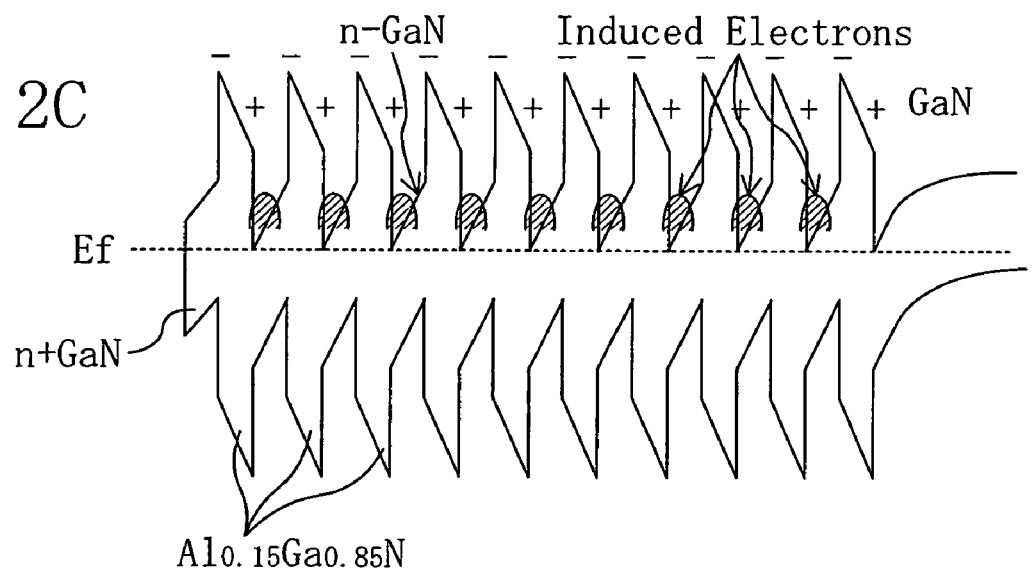
FIG. 2C is an energy band diagram in a cross section of the multilayer film vertical to a substrate surface.

FIG. 2A is a cross-sectional view showing the semiconductor device according to the second embodiment. FIG. 2B is an enlarged cross-sectional view showing a structure of a multilayer film 23 in the semiconductor device of the present embodiment. FIG. 2C is an energy band diagram in a cross section of the multilayer film 23 vertical to a substrate surface.

As shown in FIG. 2A, the semiconductor device of the present embodiment comprises: a sapphire substrate 21; a semiconductor layer 22 serving as an active layer and made of GaN with a thickness of about 2 μm which is provided on the sapphire substrate 21; a multilayer film 23 consisting of ten $Al_{0.15}Ga_{0.85}N$ layers each having a thickness of 1 nm and ten GaN layers each having a thickness of 1 nm which are alternately deposited by epitaxial growth on the semiconductor layer 22; and an electrode 24 made of Li vapor deposited in an ultra-high vacuum provided on the multilayer film 23. The multilayer film 23 is in ohmic contact with the electrode 24.

Of the multilayer film 23, the GaN layer 25 immediately underlying the electrode 24 is doped with Si at a high concentration of, e.g., about $5 \times 10^{19}$ cm$^{-3}$. Each of the Al$_{0.15}$Ga$_{0.85}$N layer and the GaN layers other than the GaN layer 25 has also been doped with Si at a concentration of about $5 \times 10^{19}$ cm$^{-3}$.

In the multilayer film 23 described above, positive charge and negative charge are generated in the Al$_{0.15}$Ga$_{0.85}$N layer and the GaN layer, respectively, due to a spontaneous polarization difference and a piezopolarization difference between the two materials, as shown in FIG. 2C. Since the multilayer film 23 has been doped with an n-type impurity (Si), a large amount of free charge composed of electrons is further induced by the polarization charge in the multilayer film 23 and accumulated at a concentration of about $1 \times 10^{13}$ cm$^{-2}$ at each of the interfaces between the Al$_{0.15}$Ga$_{0.85}$N layers and the GaN layers. This corresponds to $5 \times 10^{19}$ cm$^{-3}$ in terms of volume concentration, which is exceeding an upper limit value (2 to $3 \times 10^{19}$ cm$^{-3}$) achieved by normal doping with an n-type impurity. In addition, each of the Al$_{0.15}$Ga$_{0.85}$N layers has an extremely small thickness of 1 nm so that the electrons contributing to conduction in the GaN layer easily tunnel through the potential barrier of the Al$_{0.15}$Ga$_{0.85}$N layer and therefore an electric resistance does not increase in the multilayer film 23.

Moreover, Li which is extremely low in work function has been used for the electrode in the semiconductor device according to the present embodiment, as shown in FIG. 2C. Accordingly, the height of the potential barrier between the electrode 24 and the GaN layer 25 is lower by about 1 eV than that in the first embodiment using the Ti/Al electrode. As a result, the contact resistance between the electrode 24 and the GaN layer 25 has been reduced by about 20%.

Although Li has been listed as an example of the metal having a low work function in the description of the present embodiment, the contact resistance can also be reduced to a value lower than in the conventional embodiment if another metal having a work function of 3 eV or less such as Na, K, Ca, Rb, Sr, Ba, Ce, Pr, Nd, Pm, Sm, Eu, Gd, Tb, Dy, Ho, Er, or Yb is used. However, Na and K are rarely used in a practical situation since they react with moisture or the like.

Embodiment 3

As a third embodiment of the present invention, an example which uses the multilayer film described in each of the first and second embodiments in a heterojunction field effect transistor (HFET) will be described.

Figure 3A:
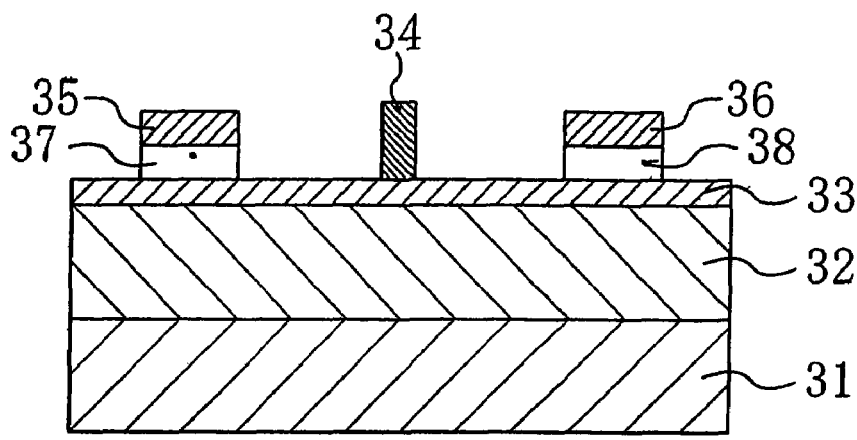
FIG. 3A is a cross-sectional view showing a semiconductor device according to a third embodiment of the present invention.
Figure 3B:
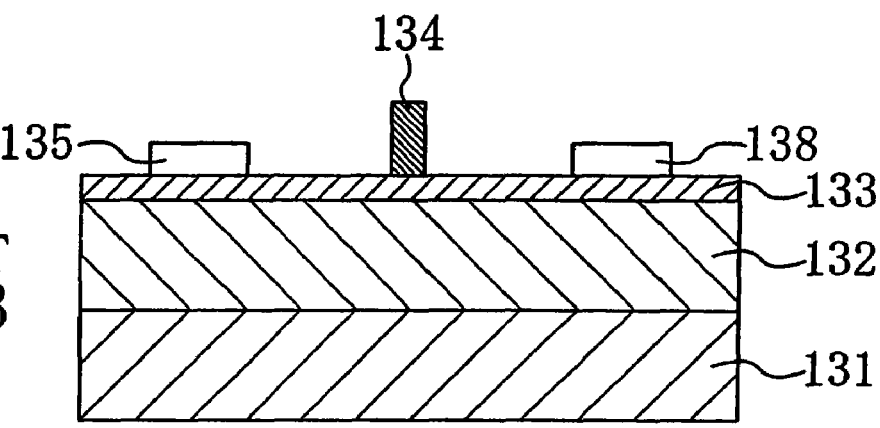
FIG. 3B is a cross-sectional view showing a conventional semiconductor device.
Figure 3C:
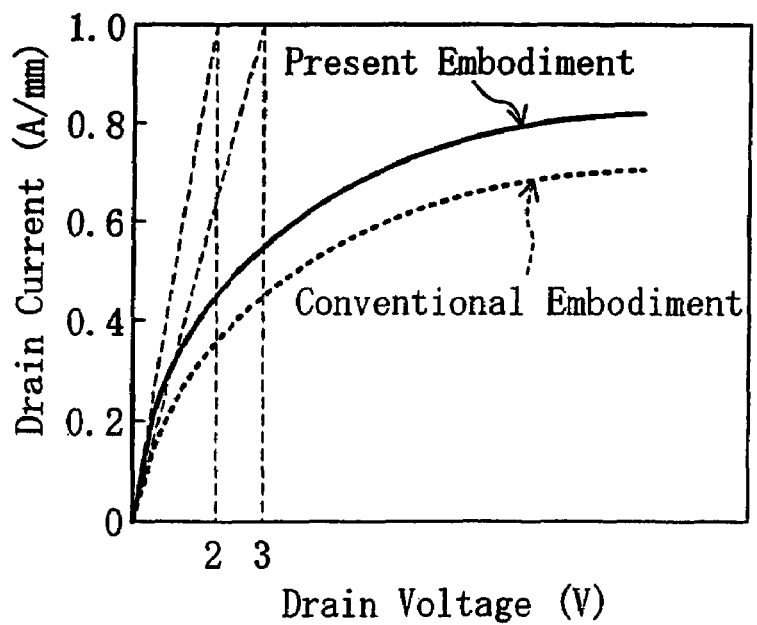
FIG. 3C is a view showing a relationship between a drain voltage and a drain current in each of the semiconductor device of the third embodiment and a conventional semiconductor device.

FIG. 3A is a cross-sectional view showing a semiconductor device according to the third embodiment. FIG. 3B is a cross-sectional view showing a conventional semiconductor device. FIG. 3C is a view showing a relationship between a drain voltage and a drain current in each of the semiconductor device of the present embodiment and the conventional semiconductor device.

As shown in FIG. 3A, the semiconductor device of the present embodiment comprises: an SiC substrate 31; a semiconductor layer 32 made of GaN with a thickness of 3 μm which is provided on the SiC substrate 31 to function as a channel layer; a barrier layer 33 made of Al$_{0.25}$Ga$_{0.75}$N having a thickness of 25 nm and provided on the semiconductor layer 32; a gate electrode 34 provided on the barrier layer 33; a first multilayer film 37 provided on the semiconductor layer 32; a second multilayer film 38 provided at a position on the semiconductor layer 32 to have the gate electrode 34 interposed between itself and the first multilayer film 37; a Ti/Al source electrode 35 provided to be in ohmic contact with the first multilayer film 37; and a Ti/Al drain electrode 36 provided to be in ohmic contact with the second multilayer film 38.

Each of the first and second multilayer films 37 and 38 has a structure in which about ten Al$_{0.15}$Ga$_{0.85}$N layers and about ten GaN layers having mutually different polarization characteristics are alternately stacked. Of the first and second multilayer films 37 and 38, the uppermost GaN layers have been doped with Si at about $5 \times 10^{19}$ cm$^{-3}$, while the other layers composing the first and second multilayer films 37 and 38 have been doped with Si at about $4 \times 10^{18}$ cm$^{-3}$.

With the foregoing structure, it becomes possible to reduce the contact resistance in each of the source and drain electrodes to a value lower than in the conventional semiconductor device shown in FIG. 3B, i.e., in the conventional semiconductor device in which the Ti/Al ohmic electrodes 135 and 138 are formed directly on the Al$_{0.25}$Ga$_{0.75}$N layer 133. The conventional semiconductor device depicted in FIG. 3B also includes gate electrode 134, substrate 131, and semiconductor layer 132.

FIG. 3C shows an Ids-Vds curve obtained from each of the semiconductor device of the present embodiment and the conventional semiconductor device when the gate voltage is 0 V, as described above. From the drawing, it will be understood that the ON resistance of the semiconductor device according to the present embodiment is 2 Ω·mm and the ON resistance of the conventional semiconductor device is 3 Ω·mm and therefore the ON resistance of the semiconductor device of the present embodiment has greatly been reduced compared with that of the conventional semiconductor device.

Thus, according to the semiconductor device of the present embodiment, the contact resistance, the contact resistance is reduced to be lower than in the conventional semiconductor device and the driving current can be increased.

In the semiconductor device according to the present embodiment, an Al concentration in the Al$_x$Ga$_{1-x}$N layer has been set to a value lower than in the barrier layer 33 such that the potential barrier of the Al$_x$Ga$_{1-x}$N layer in a direction vertical to the substrate surface is reduced. In addition, the thickness of each of the Al$_x$Ga$_{1-x}$N layers in the first and second multilayer films 37 and 38 has been adjusted to 1 nm which is smaller than the thickness of the barrier layer 33 for easy tunneling of electrons so that an increase in resistance value is suppressed.

Embodiment 4

As a fourth embodiment of the present invention, a semiconductor device obtained by changing the configuration of each of the first and second multilayer films of the semiconductor device according to the third embodiment will be described.

Figure 4A:
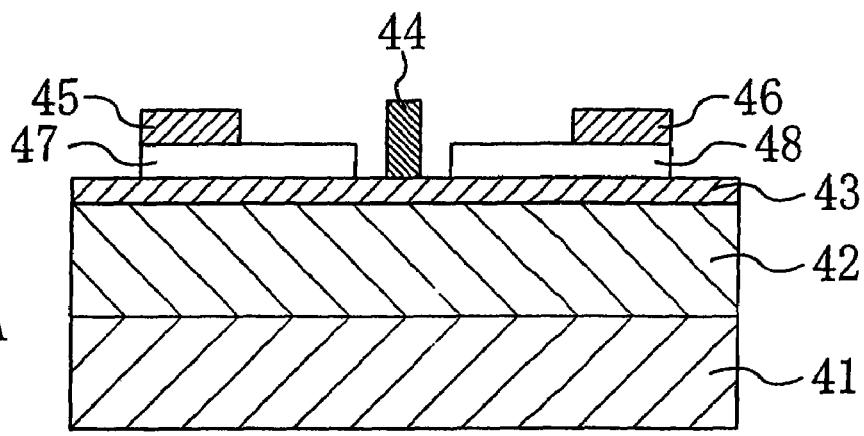
FIG. 4A is a cross-sectional view showing a semiconductor device according to a fourth embodiment of the present invention.
Figure 4B:
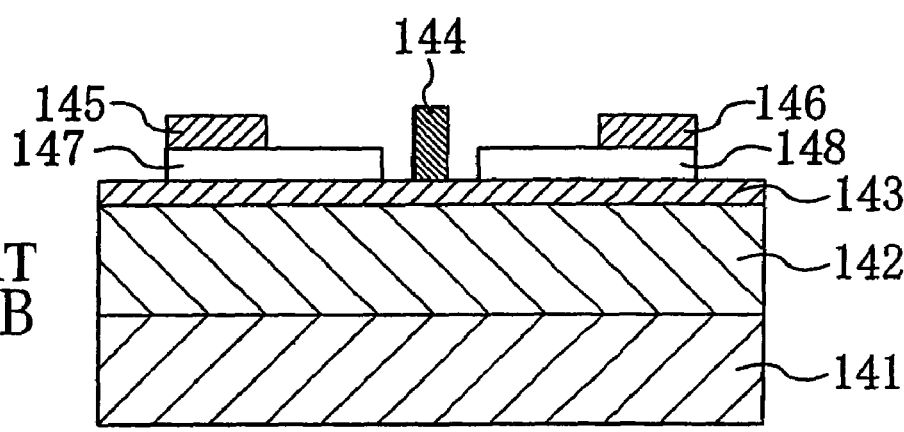
FIG. 4B is a cross-sectional view showing a conventional semiconductor device.
Figure 4C:
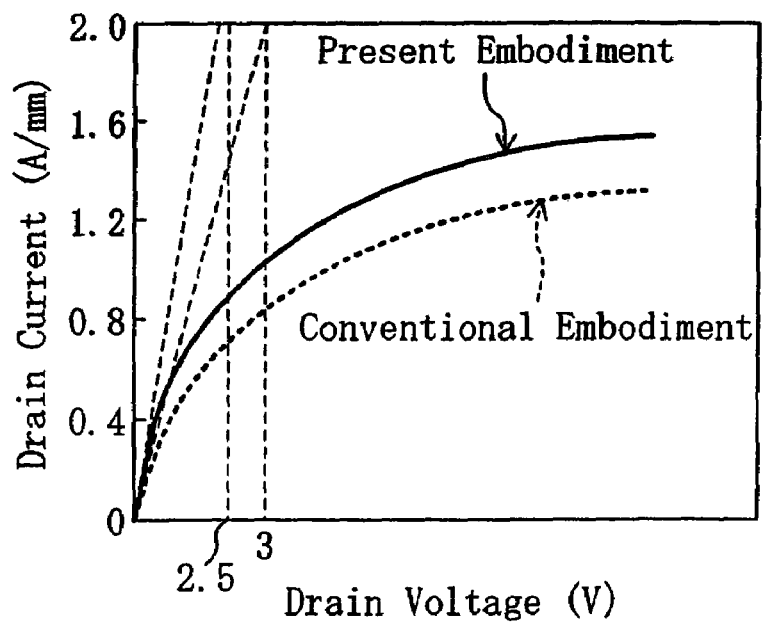
FIG. 4C is a view showing a relationship between a drain voltage and a drain current in each of the semiconductor device of the fourth embodiment and a conventional semiconductor device.

FIG. 4A is a cross-sectional view showing a semiconductor device according to the fourth embodiment. FIG. 4B is a cross-sectional view showing a conventional semiconductor device. FIG. 4C is a view showing a relationship between a drain voltages and a drain current in each of the semiconductor device according to the present embodiment and the conventional semiconductor device.

As shown in FIG. 4A, the semiconductor device according to the present embodiment comprises: an SiC substrate 41; a semiconductor layer 42 made of GaN with a thickness of 3 μm which is provided on the SiC substrate 41 to function as a channel layer; a barrier layer 43 made of Al$_{0.25}$Ga$_{0.75}$N having a thickness of 25 nm and provided on the semiconductor layer 42; a gate electrode 44 provided on the barrier layer 43; a first multilayer film 47 provided on the semiconductor layer 42; a second multilayer film 48 provided at a position on the semiconductor layer 42 to have the gate electrode 44 interposed between itself and the first multilayer film 47; a Ti/Al source electrode 45 provided to be in ohmic contact with the first multilayer film 47; and a Ti/Al drain electrode 46 provided to be in ohmic contact with the second multilayer film 48.

The semiconductor device according to the present embodiment is characterized in that each of the first and second multilayer films 47 and 48 has a recessed structure provided to reach a position close to the gate electrode 44. Each of the distance between the first multilayer 47 and the gate electrode 44 and the distance between the second multilayer 48 and the gate electrode 44 is assumed to be about not less than 10 nm and not more than 500 nm. Accordingly, the source electrode 45, the first multilayer film 47, and the barrier layer 43 are formed to present a staircase configuration oriented toward the gate electrode 44. The drain electrode 46, the second multilayer 48, and the barrier layer 43 are also formed in the same manner.

By contrast, the conventional semiconductor device shown in FIG. 4B comprises first and second cap layers 147 and 148 each provided on a barrier layer 143 and made of GaN containing an impurity at a high concentration. As for the components other than the first and second cap layers 147 and 148, they are the same as those of the semiconductor device of the present embodiment. The conventional semiconductor device includes substrate 141, drain electrode 146, source electrode 145, and semiconductor layer 142.

In the conventional semiconductor device, an attempt to lower a parasitic resistance composed mainly of a source resistance has been made by expanding the first and second heavily doped cap layers 147 and 148 to a position close to the gate electrode 144. In the semiconductor device of the present embodiment, the source resistance has been reduced greatly, if compared with that in the first embodiment, by replacing the first and second cap layers 147 and 148 with the multilayer films. A majority of carriers enter from the source electrode 45 into the first multilayer film 47, flow in the first multilayer film 47 in the direction of the gate electrode parallel to the substrate surface, and flow therefrom into the semiconductor layer 42. In the semiconductor device according to the present embodiment, therefore, it is possible to not only reduce the contact resistance between the ohmic electrode and the semiconductor layer but also suppress the parasitic resistance on a path along which the carriers flow and supply carriers at a high concentration to the channel, so that the current driving ability has further been improved.

FIG. 4C shows an Ids-Vds curve obtained from each of the semiconductor device of the present embodiment and the conventional semiconductor device when the gate-to-source voltage is 0 V, as described above. From the drawing, it will be understood that the ON resistance of the semiconductor device according to the present embodiment is 1.25 Ω·mm and the ON resistance of the conventional semiconductor device is 1.5 Ω·mm and therefore the ON resistance of the semiconductor device of the present embodiment has greatly been reduced compared with that of the conventional semiconductor device.

A method for fabricating the semiconductor device according to the present embodiment will be described with reference to FIG. 5.

FIGS. 5A to 5D are cross-sectional views illustrating the method for fabricating the semiconductor device according to the present embodiment.

Figure 5A:
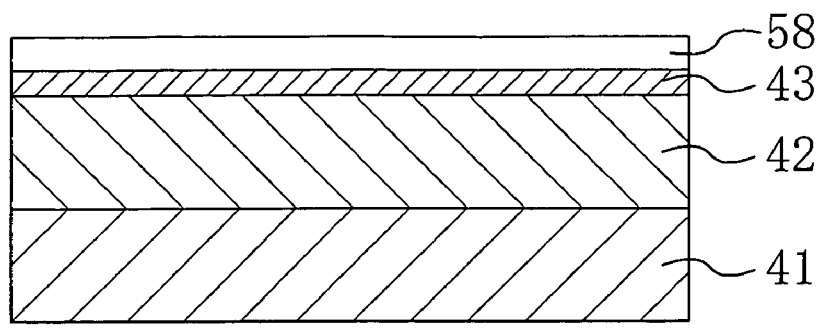
FIGS. 5A to 5D are cross-sectional views illustrating a method for fabricating a semiconductor device according to the present embodiment.

First, as shown in FIG. 5A, the semiconductor layer 42 made of GaN with a thickness of 3 μm is formed on the SiC substrate 41. Then, the barrier layer 43 made of $Al_{0.25}Ga_{0.75}N$ with a thickness of 25 nm is formed on the semiconductor layer 42. Further, ten $Al_{0.15}Ga_{0.85}N$ layers and ten GaN layers each having a thickness of 1 nm are alternately stacked on the barrier layer 43 to form a multilayer film 58. The present step forms the multilayer film 58 by metal organic chemical vapor deposition (MOCVD).

Figure 5B:
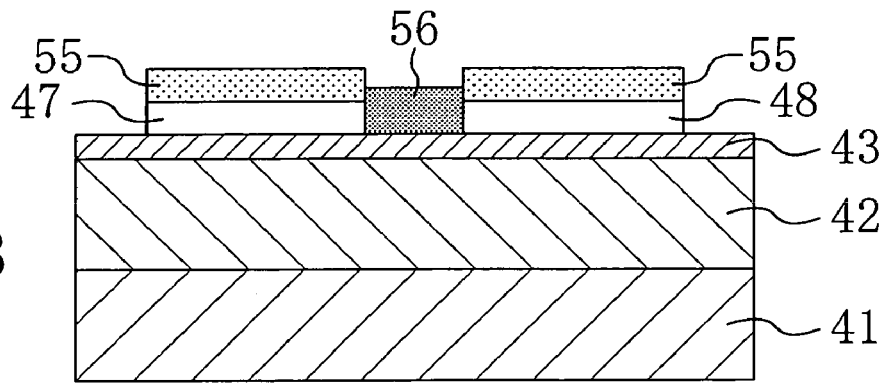

Next, as shown in FIG. 5B, the region of the substrate other than a gate formation region is covered with an Si film 55 with a thickness of 100 nm. Thereafter, annealing is performed in a 100% oxygen atmosphere at 1000° C. for 10 minutes, thereby oxidizing the exposed portion of the upper surface of the multilayer film 58 and form an Al/Ga mixed oxide film ($Al_xGa_yO_3$, $0 \leq x \leq 2$, $0 \leq y \leq 1$, x+y=2) 56.

Figure 5C:
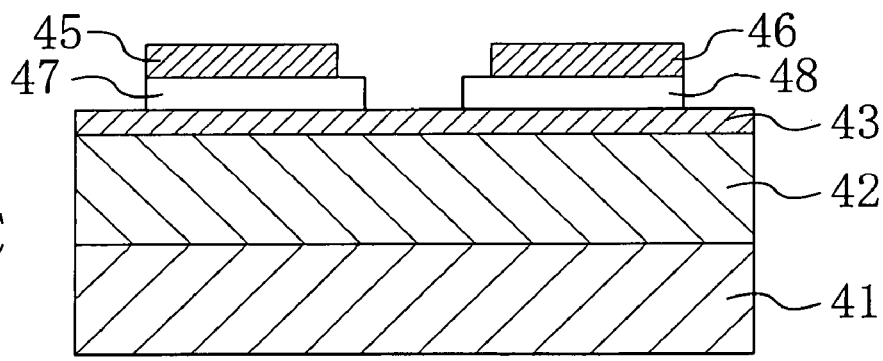

Subsequently, as shown in FIG. 5C, an Si coating film resulting from the oxidation of the exposed surface is removed by using a hydrofluoric/nitric acid and then the mixed oxide film 56 is removed by using an $NH_4OH$ solution so that the first and second multilayer films 47 and 48 are formed. Then, a Ti/Al film serving as the source electrode 45 and a Ti/Al film serving as the drain electrode 46 are deposited in this order and annealing is performed in a 100% $H_2$ atmosphere at 550° C. for one minute, thereby bringing the source electrode 45 and the drain electrode 46 into excellent ohmic contact with the multilayer film 48.

Figure 5D:
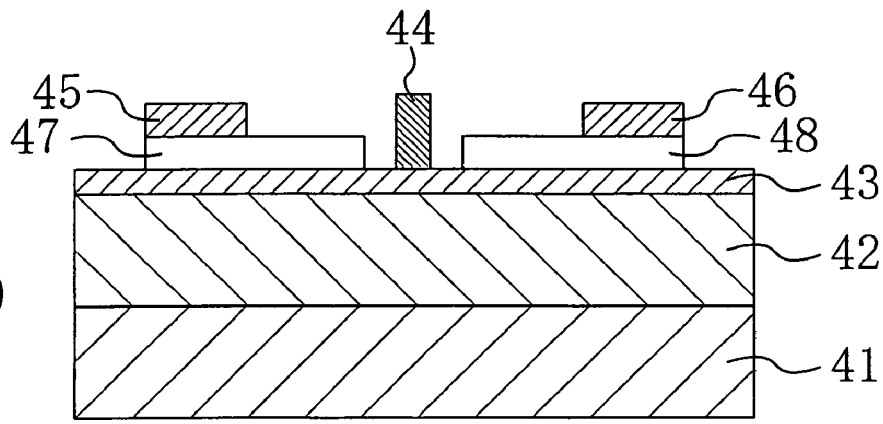

Next, as shown in FIG. 5D, a Pd—Si alloy is deposited on the barrier layer 43 by vacuum vapor deposition and then the gate electrode 44 is formed by a lift-off process. Thereafter, the formation of a surface protection film and a wiring step (not shown) are performed. Thus, the semiconductor device according to the present embodiment is produced by the foregoing process.

In the semiconductor device according to the present embodiment, the Al concentration is higher in the barrier layer 43 than in each of the $Al_{0.15}Ga_{0.85}N$ layers in the first and second multilayer films 47 and 48. Accordingly, the barrier layer 43 is less likely to be oxidized than the multilayer film 48. As a result, oxidation is easily stopped at the barrier layer 43 in the oxidation step shown in FIG. 5B and the depth of the recess can be controlled precisely.

Embodiment 5

As a fifth embodiment of the present invention, a semiconductor device using a multilayer film with a so-called δ-doped structure will be described.

Figure 6A:
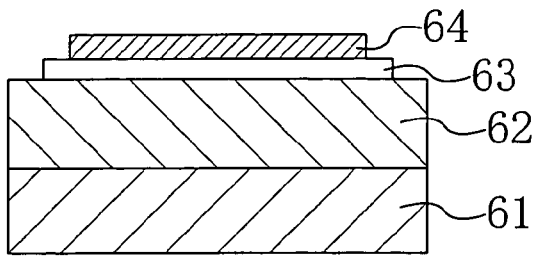
FIG. 6A is a cross-sectional view showing a semiconductor device according to a fifth embodiment of the present invention.
Figure 6B:
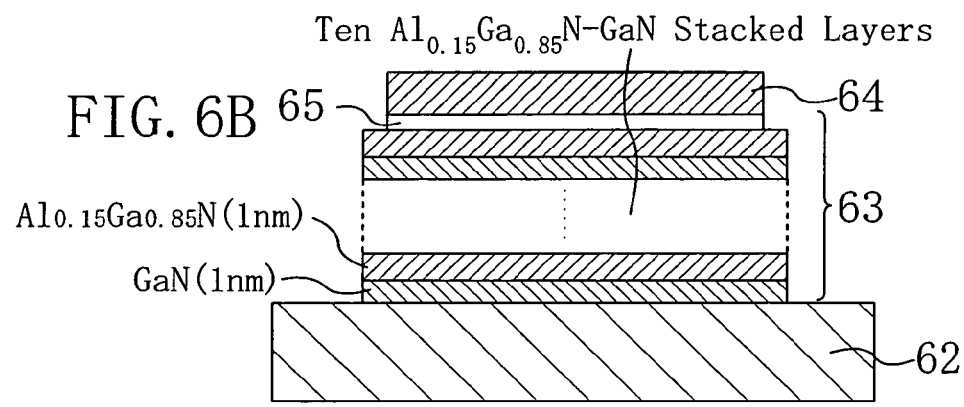
FIG. 6B is an enlarged cross-sectional view showing a structure of a multilayer film in the semiconductor device according to the fifth embodiment.
Figure 6C:
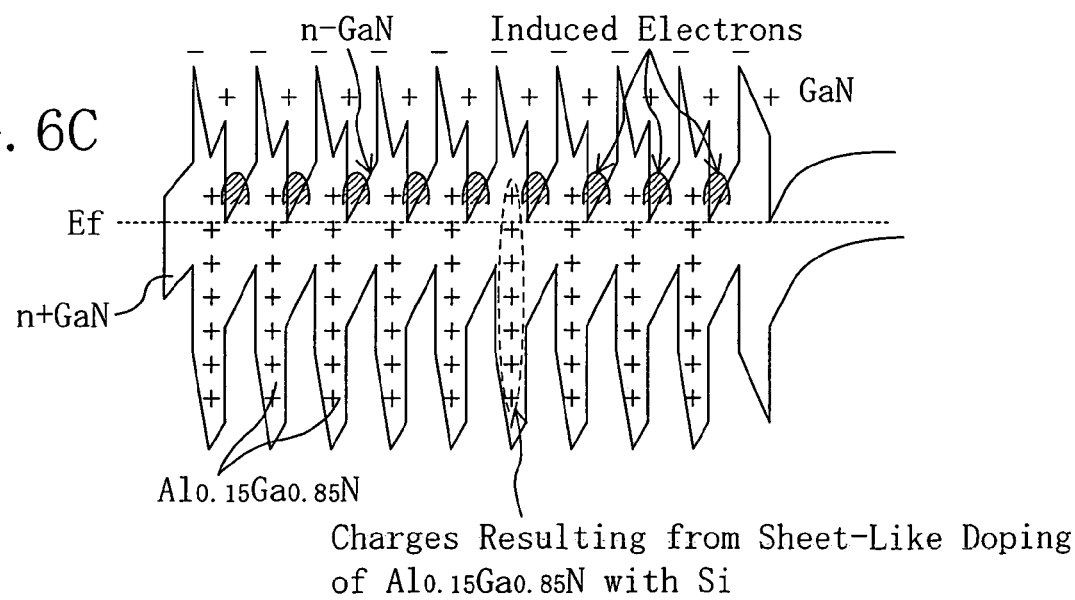
FIG. 6C is an energy band diagram in a cross section of the multilayer film vertical to a substrate surface.

FIG. 6A is a cross-sectional view showing the semiconductor device according to the fifth embodiment. FIG. 6B is an enlarged cross-sectional view showing a structure of a multilayer film 63 in the semiconductor device according to the present embodiment. FIG. 6C is an energy band diagram in a cross section of the multilayer film 63 vertical to a substrate surface.

As shown in FIGS. 6A and 6B, the semiconductor device according to the present embodiment comprises: a sapphire substrate 61; a semiconductor layer 62 made of a gallium nitride (GaN) with a thickness of about 2 μm which is provided on the sapphire substrate 61; a multilayer film 63 consisting of ten $Al_{0.15}Ga_{0.85}N$ layers each having a thickness of 1 nm and ten GaN layers each having a thickness of 1 nm which are alternately deposited by epitaxial growth on the semiconductor layer 62; and an electrode 64 formed on the multilayer film 63 and made of Li. The multilayer film 63 is in ohmic contact with the electrode 64.

Of the multilayer film 63 in the semiconductor device of the present embodiment, the GaN layer 65 immediately underlying the electrode 64 is doped with Si at a high concentration of, e.g., about $5 \times 10^{19}$ cm$^{-3}$, while each of the GaN layers other than the GaN layer 65 is doped with Si at a concentration of about $1\times10^{18}$ cm$^{-3}$. In addition, the vicinity of the center of each of the $Al_{0.15}Ga_{0.85}N$ layers composing the multilayer film 63 is doped with Si in a sheet-like configuration which corresponds to two atomic layers. It is to be noted that this δ-doped layer can be formed by performing Si pulse doping using MOCVD. It is defined herein that the δ-doped layer is a layer having a thickness of about 10 nm or less, containing an impurity at a higher concentration than in an ambient layer, and having a sharp concentration profile.

In the foregoing structure, polarization charge resulting from a spontaneous polarization difference and a piezopolarization difference between the two materials occurs at each of the interfaces between the $Al_{0.15}Ga_{0.85}N$ layers and the GaN layers in the same manner as in the first embodiment. Since the GaN layer is doped with an n-type impurity (Si) in the present embodiment, a large amount of free charge composed of electrons is further generated and accumulated at a concentration of about $1\times10^{13}$ cm$^{-2}$ at each of the interfaces between the $Al_{0.15}Ga_{0.85}N$ layers and the GaN layers. This corresponds to $7\times10^{19}$ cm$^{-3}$ in terms of a volume concentration, which is exceeding an upper limit value of $5\times10^{19}$ cm$^{-3}$ achieved by normal doping with an n-type impurity.

In addition, each of the $Al_{0.15}Ga_{0.85}N$ layers has an extremely small thickness of 1.5 nm and the vicinity of the center portion of the multilayer film 63 in the stacking direction thereof is doped with Si. Accordingly, the potential of the $Al_{0.15}Ga_{0.85}N$ layer lowers in the vicinity of the center and the electrons contributing to conduction in the GaN layer can more easily tunnel through the potential barrier of the $Al_{0.15}Ga_{0.85}N$ layer than in the second embodiment.

Moreover, Li which is lower in work function than Ti/Al has been used as the material of the electrode 64 in the semiconductor device of the present embodiment. Accordingly, the height of the potential barrier between the GaN layer 65 immediately under the electrode 64 and the electrode 64 is lower by about 1 eV than in the case of using Ti/Al. As a result, the contact resistance has been reduced by about 20%.

In the semiconductor device according to the present embodiment also, Na, K, Ca, Rb, Sr, Ba, Ce, Pr, Nd, Pm, Sm, Eu, Gd, Tb, Dy, Ho, Er, Yb, or the like may be used as the material of the electrode 64.

By applying the structure of the ohmic contact shown herein to a HFET as used in the third embodiment or to a HFET with the extended first and second multilayer films as used in the fourth embodiment, the driving current can further be increased.

Although the impurity has been introduced into the GaN layers including the GaN layer 65 and into each of the $Al_{0.15}Ga_{0.85}N$ layers in the multilayer film 63, the impurity may be introduced only into the GaN layer 65 or only into the GaN layer 65 and the $Al_{0.15}Ga_{0.85}N$ layer. However, the introduction of the impurity into the $Al_{0.15}Ga_{0.85}N$ layer, which is larger in band gap, is preferred since it can reduce the contact resistance.

Embodiment 6

As a sixth embodiment of the present invention, an example which forms a δ-doped layer in a barrier layer in the HFET according to the third embodiment will be described.

Figure 7A:
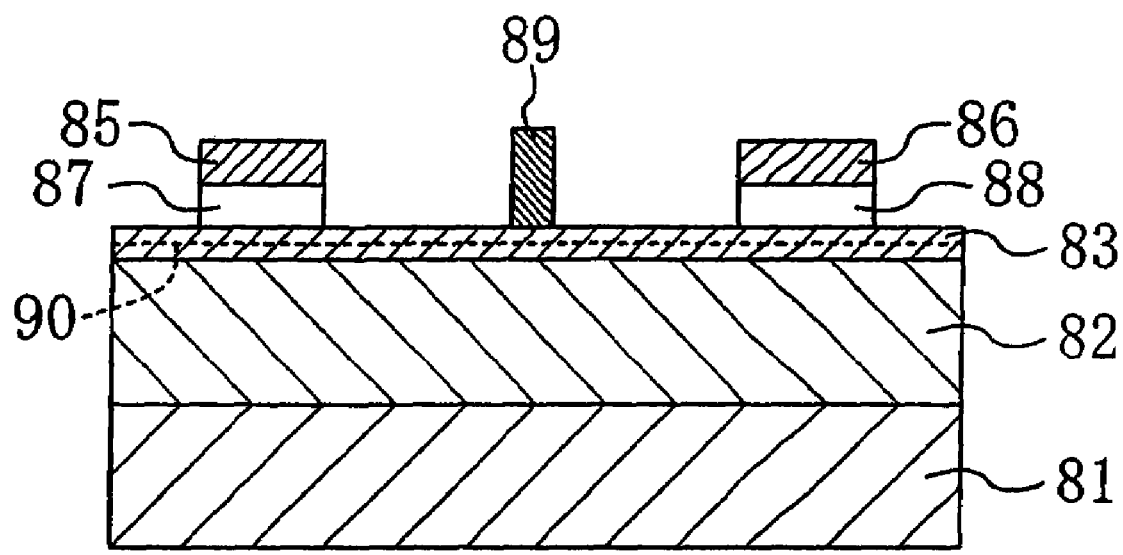
FIG. 7A is a cross-sectional view showing a semiconductor device according to a sixth embodiment and FIG. 7B is a cross-sectional view showing a conventional semiconductor device having the same structure as the semiconductor device shown in FIG. 3B.
Figure 7B:
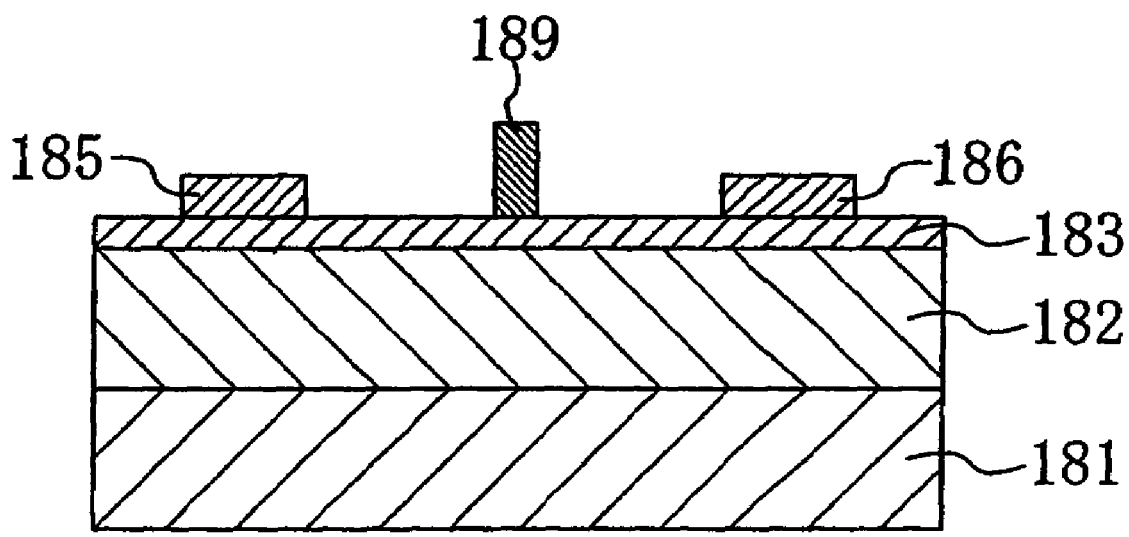
Figure 8A:
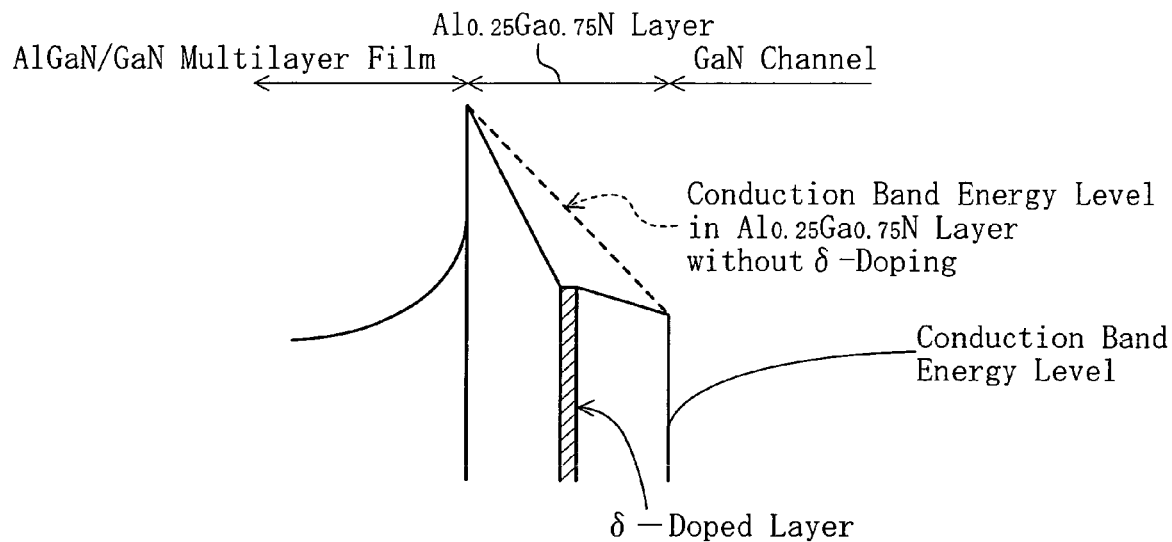
FIG. 8A is a view showing a conduction band energy level in a direction of depth in the vicinity of a barrier layer in the semiconductor device according to the sixth embodiment and FIG. 8B is a view showing a relationship between a drain voltage and a drain current in each of the semiconductor device of the sixth embodiment and the conventional semiconductor device.
Figure 8B:
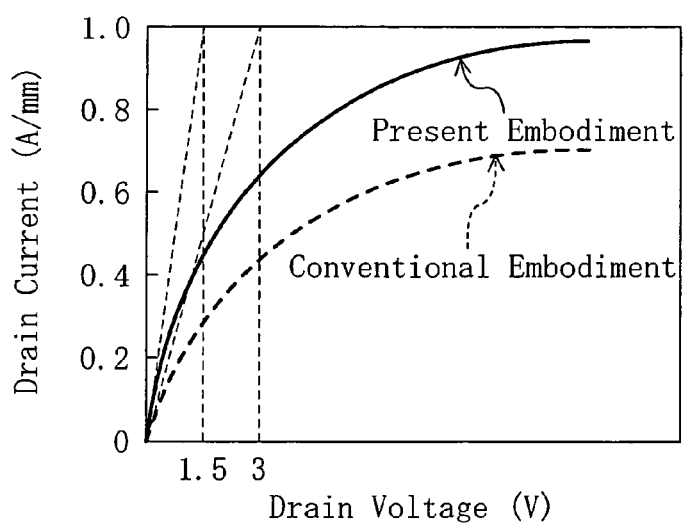

FIG. 7A is a cross-sectional view showing a semiconductor device according to the sixth embodiment. FIG. 7B is a cross-sectional view showing a conventional semiconductor device having the same structure as the semiconductor device shown in FIG. 3B. FIG. 8A is a view showing a conduction band energy level in a direction of depth in the vicinity of a barrier layer in the semiconductor device of the present embodiment. FIG. 8B is a view showing a relationship between a drain voltage and a drain current in each of the semiconductor device of the present embodiment and the conventional semiconductor device.

As shown in FIG. 7A, the semiconductor device of the present embodiment comprises: an SiC substrate 81; a semiconductor layer 82 made of GaN with a thickness of a 3 μm which is provided on the SiC substrate 81 to function as a channel layer; a barrier layer 83 made of $Al_{0.25}Ga_{0.75}N$ having a thickness of 25 nm and provided on the semiconductor layer 82; a gate electrode 84 provided on the barrier layer 83; a first multilayer film 87 provided on the semiconductor layer 82; a second multilayer film 88 provided at a position on the semiconductor layer 88 to have the gate electrode 89 interposed between itself and the first multilayer film 87; a Ti/Al source electrode 85 provided to be in ohmic contact with the first multilayer film 87; and a Ti/Al drain electrode 86 provided to be in ohmic contact with the second multilayer film 88.

Each of the first and second multilayer films 87 and 88 has a structure in which about ten $Al_{0.15}Ga_{0.85}N$ layers and about ten GaN layers having mutually different polarization characteristics are alternately stacked. Of the first and second multilayer films 87 and 88, the uppermost GaN layers have been doped with Si at about $5\times10^{19}$ cm$^{-3}$, while the other layers composing the first and second multilayer films 87 and 88 have been doped with Si at about $4\times10^{18}$ cm$^{-3}$.

In addition to the foregoing structure, a δ-doped layer 90 having a thickness of 1.5 nm and containing Si has been formed at a position in the barrier layer 83 at a distance of 2 nm from the upper surface of the barrier layer 83 in the semiconductor device of the present embodiment. A Si concentration in the δ-doped layer 90 is about $3\times10^{19}$ cm$^{-3}$. The δ-doped layer 90 can be formed by, e.g., implanting Si ions. The impurity contained in the δ-doped layer 90 is preferably of the same conductivity type as that of the impurity introduced into each of the first and second multilayer films 87 and 88.

As can be seen from FIG. 5C, the formation of the δ-doped layer 90 allows electrons to be supplied therefrom so that numerous positively charged Si ions are formed in the δ-doped layer 90. As a result, the energy level in the vicinity of the δ-doped layer 90 lowers and the width of the barrier in the barrier layer 83 (which is denoted as "$Al_{0.25}Ga_{0.75}N$ layer" in FIG. 7A) viewed from the electrode side (which is the left-hand side of the AlGaN layer in FIG. 8A) becomes smaller than in the case where the δ-doped layer 90 is not formed (dotted line). Accordingly, the probability of passing through the barrier is higher in the semiconductor device of the present embodiment than in the conventional semiconductor device. In the semiconductor device of the present embodiment, therefore, the source/drain contact resistance is reduced to a value lower than in the conventional semiconductor device shown in FIG. 7B in which the ohmic electrodes 185 and 186 are formed directly on the barrier layer 182 or in the semiconductor device according to the third embodiment in which the δ-doped layer is not formed. The conventional semiconductor device also includes substrate 181, barrier layer 183, and gate electrode 189.

FIG. 5D shows an Ids-Vds curve obtained from each of the semiconductor device of the present embodiment and the conventional semiconductor device when the gate voltage is 0 V, as described above. From the drawing, it will be understood that the ON resistance of the semiconductor device according to the present embodiment is 1.5 Ω·mm and the ON resistance of the conventional semiconductor device is 3 Ω·mm and therefore the ON resistance of the semiconductor device of the present embodiment has greatly been reduced compared with that of the conventional semiconductor device.

A description will be given to the result of an experiment on the effect of reducing the contact resistance when the δ-doped layer is provided in the barrier layer.

Figures 9A, 9B, 10:
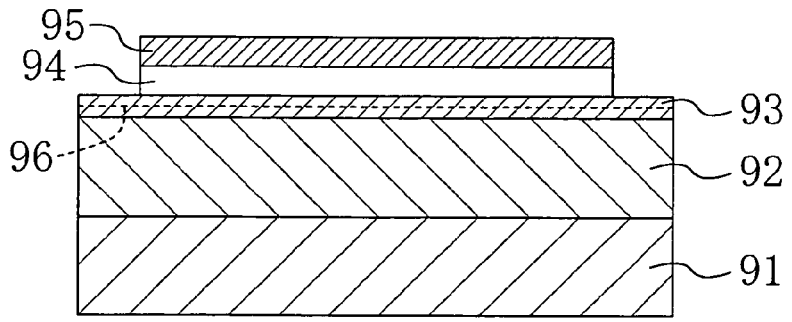
FIG. 9A is a cross-sectional view showing a semiconductor device used to test an effect achieved by forming a δ-doped layer and FIG. 9B is a view showing the result of measuring respective contact resistances and respective sheet resistances in the cases of forming and not forming the δ-doped layer in the barrier layer.
FIG. 10 is a view showing the result of measuring contact resistances when a combination of the thicknesses of semiconductor layers composing a multilayer film are varied in a semiconductor device according to the present invention.
Figure 11A:
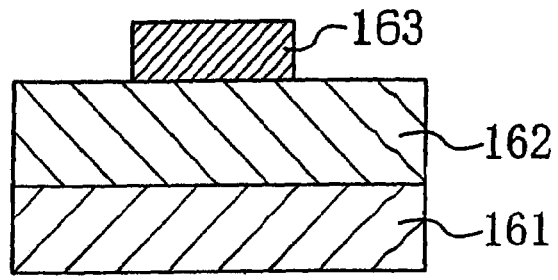
FIGS. 11A and 11B are cross-sectional views each illustrating a method for forming an ohmic contact in a channel in a conventional semiconductor device.
Figure 11B:
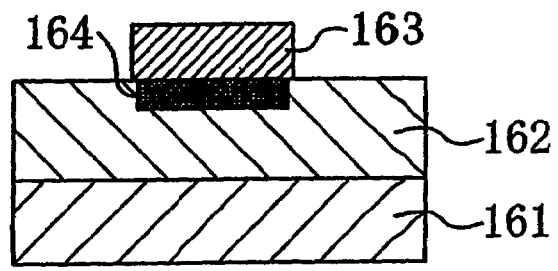
Figure 12:
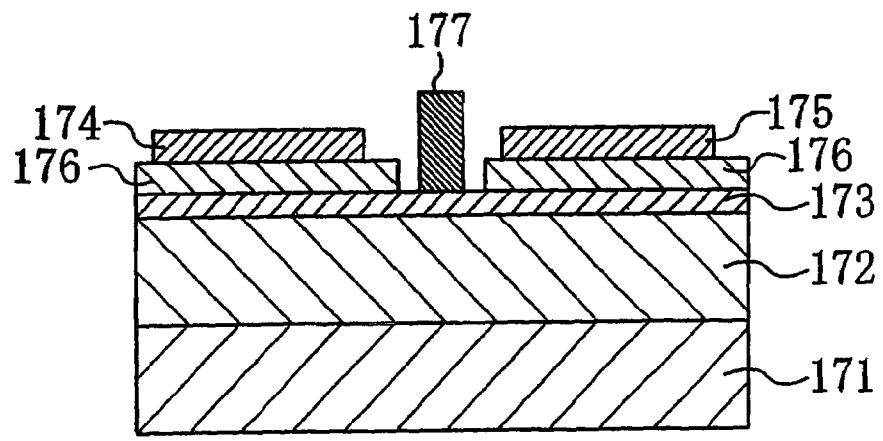
FIG. 12 is a cross-sectional view showing an example of the conventional semiconductor device formed with the ohmic contact.

FIG. 9A is a cross-sectional view showing a semiconductor device used to test an effect achieved by forming the δ-doped layer. FIG. 9B is a view showing the result of measuring respective contact resistances and respective sheet resistances in the cases of forming and not forming the δ-doped layer in the barrier layer. It is assumed that a sample 2 of the semiconductor device used in the present test has the same structure as the semiconductor device of the present embodiment, including substrate 91 and semiconductor 92, except for the δ-doped layer 96 provided in the region of the barrier layer 93 positioned at a distance of 2 nm from the upper surface of the barrier layer 93. By contrast, a sample 1 is different from the semiconductor device as the sample 2 only in that the δ-doped layer 96 has not been provided therein.

As a result of the experiment, it was found that the contact resistance at the interface between the ohmic electrode 95 and the multilayer film 94 in the sample 2 having the δ-doped layer 96 provided in the barrier layer 93 was reduced to about ⅓ of that in the sample 1. It was also proved that the formation of the δ-doped layer 96 allowed a 10 Ω/□ reduction in sheet resistance from 174 Ω/□ to 164 Ω/□. The sheet resistance is the resistance of an entire wafer in the state in which each of the samples is not provided with an electrode. A low sheet resistance indicates that the resistance of the entire semiconductor device is low and that a current in a direction parallel (transverse direction in FIG. 9A) to the substrate surface in the semiconductor device can be increased to a larger value.

Although the experiment examined the performance when the position of the δ-doped layer 96 in the barrier layer 93 was at a distance of 2 nm from the upper surface of the barrier layer 93, it can be considered that the contact resistance can be reduced to a value lower than in the conventional semiconductor device if the δ-doped layer 96 is provided in the region of the barrier layer 93 located at a distance of 20 nm or less from the upper surface of the barrier layer 93. If the distance from the δ-doped layer 96 to the upper surface of the barrier layer 93 exceeds 20 nm, a conduction band edge energy in the barrier layer 93 is not reduced more greatly than in the conventional semiconductor device. Accordingly, the tunneling of electrons is facilitated by adjusting the distance from the δ-doped layer 96 to the upper surface of the barrier layer 93 to 20 nm or less so that the contact resistance is reduced effectively. However, a smaller distance is provided preferably between the δ-doped layer 96 and the upper surface of the barrier layer 93. More preferably, the distance therebetween is, e.g., 2 nm or less. Although the contact resistance can be reduced provided that at least one δ-doped layer 96 is provided in the barrier layer 93, a plurality of δ-doped layers 96 may also be provided appropriately.

It is also possible to improve the performance of a semiconductor device such as a HFET to a level higher than that of a conventional semiconductor device if a doped layer having a gentler impurity profile is provided in place of the δ-doped layer 96.

Examination of Film Thickness Ratio among Semiconductor Layers Composing Multilayer Film In the semiconductor devices described in the foregoing embodiments, the contact resistance has been suppressed to a value lower than in the conventional semiconductor device by using, as the contact layer with the ohmic electrode, the multilayer film composed of two types of semiconductor layers having mutually different polarization characteristics. The contact resistance has also been suppressed by providing the δ-doped layer in which a vertical impurity profile changes sharply in the barrier layer on the channel layer.

For a further reduction in contact resistance in each of the semiconductor devices according to the foregoing embodiments, the present inventors examined an optimum combination of film thicknesses by varying the combination of the thicknesses of the $Al_{0.15}Ga_{0.85}N$ layers and the GaN layers composing the multilayer film.

FIG. 10 is a view showing the result of measuring a contact resistance when the combination of the thicknesses of semiconductor layers composing a multilayer film are varied in a semiconductor device according to the present invention. It is assumed that the semiconductor device used for the present measurement has the same structure as the semiconductor device according to the first embodiment except for the thicknesses of the $Al_{0.15}Ga_{0.85}N$ layers and the GaN layers composing the multilayer film and respective impurity concentrations in the $Al_{0.15}Ga_{0.85}N$ layers and the GaN layers composing the multilayer film. In the semiconductor device used for the present measurement, only the $Al_{0.15}Ga_{0.85}N$ layers have been doped with an n-type impurity, while the GaN layers have not intentionally been doped. In the present measurement, respective contact resistances when the ratio between the $Al_{0.15}Ga_{0.85}N$ layer and the GaN layer is 1:1, 2:1, and 4:1.

As a result, it was found that the contact resistance was highest when the ratio between the $Al_{0.15}Ga_{0.85}N$ layer and the GaN layer is 1:1 and that the contact resistance is lowest when the ratio between the $Al_{0.15}Ga_{0.85}N$ layer and the GaN layer was 4:1. From the result, it will be appreciated that, when the $Al_{0.15}Ga_{0.85}N$ layers contain an impurity, the contact resistance can be reduced by adjusting the thickness of the $Al_{0.15}Ga_{0.85}N$ layer to be larger than that of the GaN layer. Thus, the thickness of the $Al_{0.15}Ga_{0.85}N$ layer is preferably adjusted to be larger than that of the GaN layer in each of the semiconductor devices according to the foregoing embodiments.

It can be considered that the foregoing result is applicable even to the case where the multilayer film provided under the ohmic electrode is composed of a group III nitride semiconductor other than the $Al_{0.15}Ga_{0.85}N$ layers and the GaN layers. That is, when the multilayer film is composed of two types of semiconductor layers having different polarization characteristics and an impurity has been introduced into that one of the semiconductor layers larger in band gap, it is preferable to adjust the thickness of the semiconductor layer larger in band gap to be larger than that of the semiconductor layer smaller in band gap.

What is claimed is:

1. A semiconductor device comprising:
   a substrate;
   a multilayer film composed of at least one or more first semiconductor layers to be polarized and at least one or more second semiconductor layers having a polarization characteristic different from a polarization characteristic of each of the first semiconductor layers which are alternately stacked and provided on or above the substrate; and an ohmic electrode provided on the multilayer film,
wherein the multilayer film is composed of a first multilayer film and a second multilayer film, and
the ohmic electrode includes a source electrode provided on the first multilayer film and a drain electrode provided on the second multilayer film, the semiconductor device further comprising:
a third semiconductor layer provided on the substrate and under the multilayer film;
a barrier layer provided on the third semiconductor layer and under the multilayer film and made of a semiconductor larger in band gap than the third semiconductor layer; and
a gate electrode provided on the barrier.

2. The semiconductor device of claim 1, wherein the first multilayer film, the source electrode, the second multilayer film, and the drain electrode are formed to present a staircase configuration with respect to the gate electrode.

3. The semiconductor device of claim 1, wherein each of a material composing the source electrode and a material composing the drain electrode has a work function of 3 eV or less.

4. The semiconductor device of claim 1, wherein
each of the first and third semiconductor layers is made of AlGaN and
a content of Al in the third semiconductor layer is higher than the content of Al in each of the first and second semiconductor layers.

5. The semiconductor device of claim 1, wherein at least one δ-doped layer is provided in a region of the barrier layer positioned at a distance of 20 nm or less from an upper surface of the barrier layer.

* * * * *